US008119965B2

(12) United States Patent
Setoguchi

(10) Patent No.: US 8,119,965 B2
(45) Date of Patent: Feb. 21, 2012

(54) IMAGE SENSOR HAVING TWO LIGHT RECEIVING ELEMENTS AND CAMERA MODULE HAVING THE IMAGE SENSOR

(75) Inventor: Katsuhide Setoguchi, Tokyo (JP)

(73) Assignee: Kyocera Corporation, Kyoto (JP)

( * ) Notice: Subject to any disclaimer, the term of this patent is extended or adjusted under 35 U.S.C. 154(b) by 130 days.

(21) Appl. No.: 12/162,329

(22) PCT Filed: Jan. 23, 2007

(86) PCT No.: PCT/JP2007/050936

§ 371 (c)(1),
(2), (4) Date: Jul. 25, 2008

(87) PCT Pub. No.: WO2007/086352

PCT Pub. Date: Aug. 2, 2007

(65) Prior Publication Data

US 2009/0008532 A1      Jan. 8, 2009

(30) Foreign Application Priority Data

Jan. 25, 2006   (JP) .................................. 2006-16460

(51) Int. Cl.
*H01L 27/00* (2006.01)

(52) U.S. Cl. ................. 250/208.1; 250/214 R; 257/436; 348/294

(58) Field of Classification Search ............... 250/208.1, 250/214.1, 214 R, 208.2; 257/431, 432, 257/436, 440; 348/272, 274, 294, 277–280

See application file for complete search history.

(56) References Cited

U.S. PATENT DOCUMENTS

| 4,583,002 | A | | 4/1986 | Kondo et al. |
|---|---|---|---|---|
| 4,761,546 | A | * | 8/1988 | Ikari et al. .................... 356/3.04 |
| 6,531,690 | B2 | * | 3/2003 | Kozuka ....................... 250/208.1 |
| 6,903,391 | B2 | | 6/2005 | Takeuchi et al. |
| 2003/0209651 | A1 | * | 11/2003 | Iwasaki ....................... 250/214.1 |
| 2005/0029643 | A1 | * | 2/2005 | Koyanagi ....................... 257/680 |

(Continued)

FOREIGN PATENT DOCUMENTS

JP            60210080 A     10/1985

(Continued)

OTHER PUBLICATIONS

PCT Search Report for corresponding PCT application PCT/JP2007/050936 lists the references above.

*Primary Examiner* — Francis M Legasse, Jr.
(74) *Attorney, Agent, or Firm* — DLA Piper LLP (US)

(57) ABSTRACT

An image sensor able to capture an image with a suitable dynamic range even in a case where a bright/dark difference within an imaging range is large is provided. An image sensor 1 is provided with a substrate 2, a plurality of first photodiodes 5 arranged on the substrate 2 corresponding to a plurality of pixels 3, receiving light incident upon a first principal surface S1, and generating charges in accordance with the amounts of light received, and a plurality of second photodiodes 6 arranged at positions in behind side of the plurality of first photodiodes 5 corresponding to the plurality of pixels 3, receiving light incident upon the first principal surface S1 and passing through at least one of the plurality of first photodiodes 5 and the substrate 2, and generating charges in accordance with amounts of light received. Electric signals based on charges generated in the plurality of second photodiodes 6 of the same pixels are added to electric signals based on charges generated in the plurality of first photodiodes 5.

15 Claims, 14 Drawing Sheets

U.S. PATENT DOCUMENTS

2005/0206766 A1 * 9/2005 Suzuki .......................... 348/308

FOREIGN PATENT DOCUMENTS

| JP | 05243548 A | 9/1993 |
| JP | 2002076321 A | 3/2002 |
| JP | 2003169252 A | 6/2003 |
| JP | 2004103964 A | 4/2004 |
| JP | 2004335803 A | 11/2004 |
| JP | 2005086082 A | 3/2005 |
| JP | 2005327835 A | 11/2005 |

* cited by examiner

IMAGE SENSOR HAVING TWO LIGHT RECEIVING ELEMENTS AND CAMERA MODULE HAVING THE IMAGE SENSOR

CROSS-REFERENCE TO RELATED APPLICATIONS

This application is a national stage of international application No. PCT/JP2007/050936, filed on Jan. 23, 2007, and claims the benefit of priority under 35 USC 119 of Japanese Patent Application No. 2006-016460, filed on Jan. 25, 2006. The entire contents of these applications are incorporated herein by reference.

TECHNICAL FIELD

The present invention relates to a CMOS image sensor or other image sensor and a camera module provided with an image sensor.

BACKGROUND ART

In CMOS image sensors and other solid state image sensors, light receiving elements generate charges in accordance with the incident light. The charges stored in the light receiving elements are sequentially read out to acquire the image of the object to be captured. It is known that if the amount of light received becomes large, the charges end up becoming saturated at the light receiving elements and so-called "smear" occurs.

Patent Document 1 discloses a technique of providing two photodiodes at each pixel and lowering the charge (potential) of one photodiode by the charge (potential) of the other photodiode of surrounding pixels to prevent saturation of charges. Further, Patent Document 1 also discloses a technique of arranging the other photodiode immediately beneath the one photodiode.

Note that although not concerned with the technique of preventing saturation in the light receiving element, the technique of providing a photodiode on one principal surface of a substrate and, at the same time, providing a photodiode on the other principal surface is also known (Patent Documents 2 and 3).

Patent Document 1: Japanese Patent Publication (A) No. 2003-169252

Patent Document 2: Japanese Patent Publication (A) No. 5-243548

Patent Document 3: Japanese Patent Publication (A) No. 2004-103964

DISCLOSURE OF THE INVENTION

Problem to be Solved by the Invention

In the technique of Patent Document 1, charges are made relatively lower the larger the mean light amount of the surrounding pixels, therefore the captured image has a different luminance distribution from the actual one. Namely, in the technique of Patent Document 1, the luminance distribution of the obtained image is made smoother than the actual luminance distribution. Accordingly, this is unsuitable for application etc. to a technique where the bright-dark difference becomes important for detection precision such as in a vehicle mounted camera module for detecting a white line of a road based on a captured image. Therefore, it has been desired to prevent a drop in image quality due to saturation of the light reception portion while reflecting the actual luminance distribution.

Namely, it has been desired to provide an image sensor able to capture an image with a suitable dynamic range even in a case where the bright-dark difference within the imaging range is large and a camera module provided with the image sensor.

Means for Solving the Problem

An image sensor of the present invention is provided with a substrate, a first light receiving element provided for each of pixels obtained by dividing a substrate into a plurality of areas, provided on the substrate, receiving light incident upon one principal surface of the substrate, and generating a charge in accordance with an amount of light received; a second light receiving element provided for each of the pixels, provided at a position in behind side of the first light receiving element, receiving light incident upon the one principal surface and passing through at least one of the first light receiving element and the substrate, and generating a charge in accordance with the amount of light received; and an increasing portion configured so as to increase a signal level of an electric signal based on the charge generated at the first light receiving element so that the higher the signal level of the electric signal based on the charge generated at the second light receiving element of the same pixel is, the larger the increase amount is.

Preferably, the first light receiving element is provided on the one principal surface, and the second light receiving element is provided on the other principal surface of the substrate.

Preferably, the image sensor is provided with a second substrate arranged facing the other principal surface of the substrate, and the second light receiving element is provided on the second substrate.

Preferably, the first light receiving element is provided on the one principal surface of the substrate, and the second light receiving element is provided on a principal surface facing the other principal surface of the substrate in the second substrate.

Preferably, the first light receiving element is provided on the other principal surface of the substrate, and the second light receiving element is provided on the principal surface facing the other principal surface of the substrate in the second substrate.

Preferably, at least a portion of the increasing portion and an increase control portion controlling an operation of the increasing portion is provided on the second substrate.

Preferably, the increasing portion adds the electric signal based on the charge generated at the second light receiving element to the electric signal based on the charge generated at the first light receiving element of the same pixel.

Preferably, the increasing portion is provided with an amplifier amplifying the electric signal based on the charge generated at the first light receiving element, and the amplifier makes an amplification rate when amplifying the electric signal based on the charge generated at the first light receiving element higher the larger the signal level of the electric signal based on the charge generated at the second light receiving element of the same pixel.

Preferably, the image sensor is provided with a third light receiving element arranged on the same plane as the plane having a plurality of the second light receiving elements arranged thereon and a shading portion blocking the light going toward the third light receiving element from the one principal surface, and the increasing portion corrects the signal level of the electric signal based on the charge generated at the second light receiving element by subtracting a signal level of an electric signal based on a charge generated at the third light receiving element from the signal level of the electric signal based on the charge generated at the second light receiving element and increases the signal level of the electric signal based on the charge generated at the first light receiving element based on the signal level after that correction.

Preferably, the image sensor is provided with a saturation level control portion configured so as to control the saturation level of the first light receiving element so that a degree of saturation of the charge at the first light receiving element is kept within a predetermined range in the following process based on at least one of the electric signal based on the charge generated at the first light receiving element and the electric signal based on the charge generated at the second light receiving element.

Preferably, the more a pixel to an outer circumferential side of a pixel array region, the further the second light receiving element is arranged shifted to the outer circumferential side of the pixel array region with respect to the first light receiving element of the same pixel.

Preferably, the second light receiving element has a broader light receiving area than that of the first light receiving element and projected to the outer circumferential side of a pixel array region with respect to the first light receiving element.

A camera module of the present invention is provided with a lens, an image sensor in which the light from the lens forms an image, and a signal processing portion configured so as to process an electric signal output by the image sensor, wherein the image sensor is provided with a substrate, a first light receiving element provided for each of the pixels obtained by dividing a substrate into a plurality of areas, provided on the substrate, receiving light incident upon one principal surface of the substrate, and generating a charge in accordance with an amount of light received; and a second light receiving element provided for each of the pixels, provided at a position in behind side of the first light receiving element, receiving light incident upon the one principal surface and passing through at least one of the first light receiving element and the substrate, and generating a charge in accordance with the amount of light received; and the signal processing portion is configured so as to increase a signal level of an electric signal based on the charge generated at the first light receiving element so that the higher the signal level of the electric signal based on the charge generated at the second light receiving element of the same pixel is, the larger the increase amount is.

Preferably, the more a pixel is positioned away from an optical axis of the lens, the more the second light receiving element is arranged shifted in a direction away from the optical axis with respect to the first light receiving element of the same pixel.

Effect of the Invention

According to the present invention, an image can be captured with a suitable dynamic range even in a case where the bright/dark difference within the imaging range is large.

DESCRIPTION OF NOTATIONS

2 . . . substrate, 3 . . . pixel, 5 . . . first light receiving element, 6 . . . second light receiving element, SN . . . node (increasing portion), S1 . . . one principal surface, and S2 . . . other principal surface.

BEST MODE FOR CARRYING OUT THE INVENTION

First Embodiment

Figure 1:
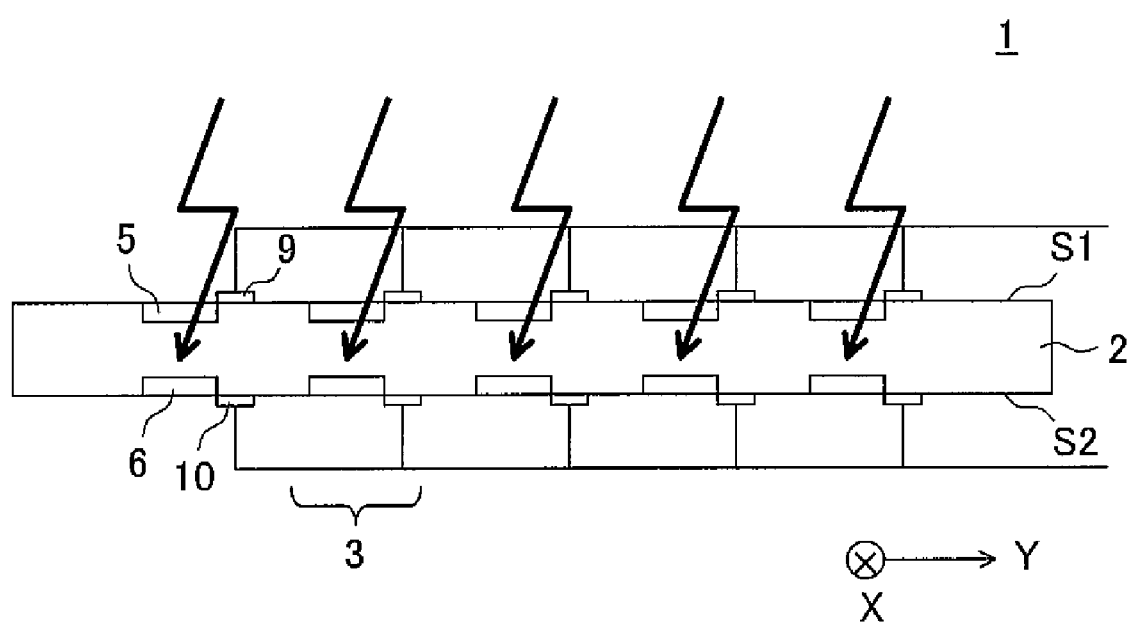
[FIG. 1] A cross-sectional view schematically showing an image sensor of a first embodiment of the present invention.

FIG. 1 is a cross-sectional view schematically showing an image sensor 1 of a first embodiment of the present invention. The image sensor 1 is configured by for example a MOS type image sensor and is provided with a substrate 2, a first photodiode (first light receiving element, photo-electric conversion element) 5 provided on a first principal surface (one principal surface) S1 of the substrate 2, and a second photodiode (second light receiving element, photo-electric conversion element) 6 provided on a second principal surface (other principal surface) S2 on the back side thereof.

One first photodiode 5 and one second photodiode 6 each are provided at each of a plurality of pixels 3 obtained by dividing the substrate 2 to several hundreds to several thousands of pixels in an X-direction (depth direction of the sheet surface) and a Y-direction (left-right direction on the sheet surface), that is, a plurality of photodiodes are arranged in the X-direction and Y-direction. Each first photodiode 5 and second photodiode 6 are arranged so as to face each other while sandwiching the substrate 2 between them.

The first photodiode 5 receives light incident upon the first principal surface S1, photoelectrically converts the received light, and generates a charge in accordance with the amount of light received. The second photodiode 6 is arranged at a position in the second principal surface S2 side of the substrate 2 of the first photodiode 5 (back side of the first photodiode 5), receives light incident upon the first principal surface S1 and passing through at least one of the first photodiode 5 and the substrate 2, photoelectrically converts the received light, and generates a charge in accordance with the amount of light received. Each pixel is provided with a first electrode 9 for detecting a signal based on a charge generated in the first photodiode 5, a second electrode 10 for detecting a signal based on a charge generated in the second photodiode 6, and so on.

Note that the configurations of the substrate 2, first photodiode 5, and first electrode 9 may be suitable well known configurations. Further, the second photodiode 6 and second electrode 10 may be given the same configurations as those of the first photodiode 5 and first electrode 9 except that they are arranged on the second principal surface S2 on the opposite side to the first principal surface S1. For example, the substrate 2 is a P-type semiconductor element substrate made of silicon (Si) as a principal material. The first photodiode 5 and second photodiode 6 are formed by PN junctions and are arranged exposing the cathode side (N-type semiconductor side) from the substrate 2 and burying the anode side (P-type semiconductor side) in the substrate 2. The second photodiode 6 is formed by the same material and to the same shape as for example the first photodiode 5 and is produced and mounted by the same processes as the production of the first photodiode 5 and the mounting onto the substrate 2.

Figure 2A:
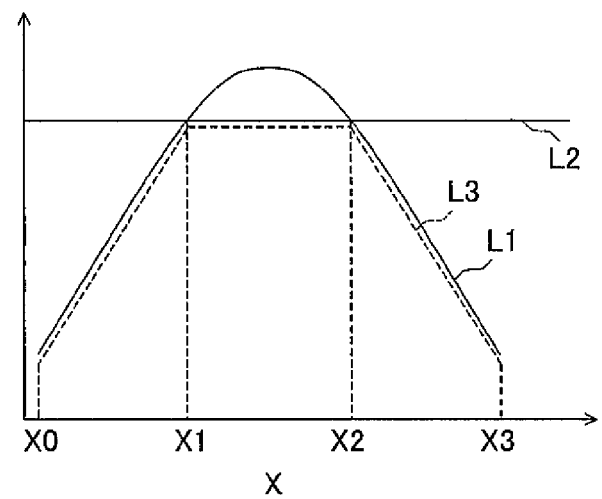
[FIG. 2] Diagrams explaining a basic concept of signal processing in the image sensor of FIG. 1.
Figure 2B:
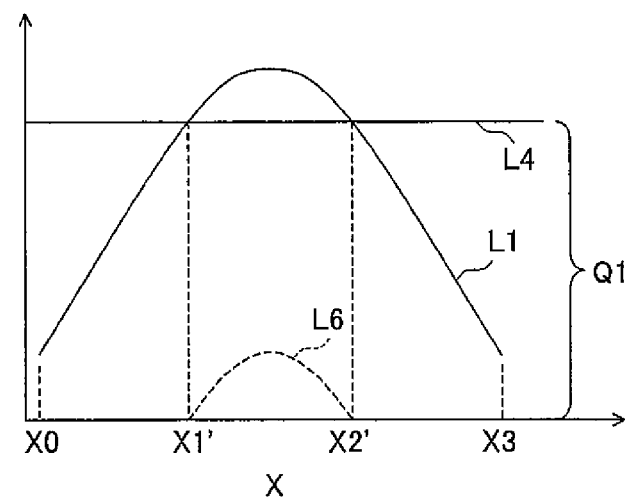
Figure 2C:
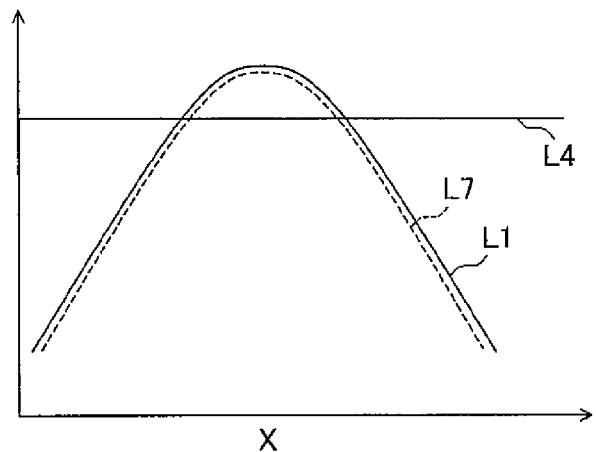

FIG. 2 are diagrams explaining a basic concept of signal processing in the image sensor 1, in which FIG. 2A shows an output signal of the first photodiode 5, FIG. 2B shows an output signal of the second photodiode 6, and FIG. 2C shows an output signal in a case where the output signal of the first photodiode 5 is corrected based on the output signal of the second photodiode 6. In each diagram, an abscissa indicates the position of the image sensor 1 in the X-direction (or Y-direction), and an ordinate indicates the amount of light received of the image sensor 1 and the signal level corresponding to the amount of light received (or one increasing the signal level) in a 1:1 ratio.

In FIG. 2A, a solid line L1 shows an example of a light amount distribution of light incident upon the first principal surface S1 of the image sensor 1 when capturing a predetermined imaging target. In this example, the light amount at the center of the first principal surface S1 is large, while the light amount becomes smaller at the two ends. A solid line L2 shows a light amount in which the charge is saturated at the first photodiode 5 and the signal level of the electric signal corresponding to the light amount, that is, the saturation level. A dotted line L3 shows the signal level of the output signal of the first photodiode 5.

The light amount of light incident upon the first principal surface S1 exceeds the saturation level in a range from x1 to x2. For this reason, the signal level of the electric signal of the first photodiode 5 become flat at a height of the saturation level in the range of x1 to x2, therefore a light amount distribution within the range of x1 to x2 cannot be specified by only the electric signal of the first photodiode 5.

On the other hand, as shown in FIG. 2B, light (solid line L1) incident upon the first principal surface S1 is absorbed by a light amount Q1 by the first photodiode 5 and the substrate 2. A light amount of a portion above a solid line L4 in the light amount indicated by the solid line L1 reaches the second photodiode 6 and is photoelectrically converted by the second photodiode 6 as indicated by a dotted line L6. Here, at least a portion of a range x1' to x2' in which the light incident upon the first principal surface S1 reaches the second photodiode 6 overlaps the range of x1 to x2.

Therefore, by correcting the signal level of the electric signal of the first photodiode 5 indicated by the dotted line L3 of FIG. 2A according to the signal level of the electric signal of the second photodiode 6 indicated by the dotted line L6 of FIG. 2B, a distribution of an electric signal (dotted line L7) suitably reflecting the light amount distribution (solid line L1) of light incident upon the first principal surface S1 can be obtained as shown in FIG. 2C. The correction method is suitable, but, for example, by adding the signal level of the electric signal of the first photodiode 5 indicated by the dotted line L3 of FIG. 2A and the signal level of the electric signal of the second photodiode 6 indicated by the dotted line L6 of FIG. 2B, the distribution of an electric signal indicated by the dotted line L7 of FIG. 2C is obtained.

Further, for example, by changing the distribution of the amplification rate when amplifying the signal of the first photodiode 5 indicated by the dotted line L3 of FIG. 2A in accordance with the distribution of the signal level of the second photodiode 6 indicated by the dotted line L6 of FIG. 2B, the distribution of an electric signal indicated by the dotted line L7 of FIG. 2C can be obtained. Namely, by making the amplification rate a constant value within the ranges of x0 to x1 (x1') and x2 (x2') to x3 and making the amplification rate higher than the constant amplification rate within a range of x1 (x1') to x2 (x2'), more concretely, by making the amplification rate higher for a portion where the signal level of the electric signal in the second photodiode 6 is higher, the distribution of the electric signal indicated by the dotted line L7 of FIG. 2C can be obtained.

Figure 3:
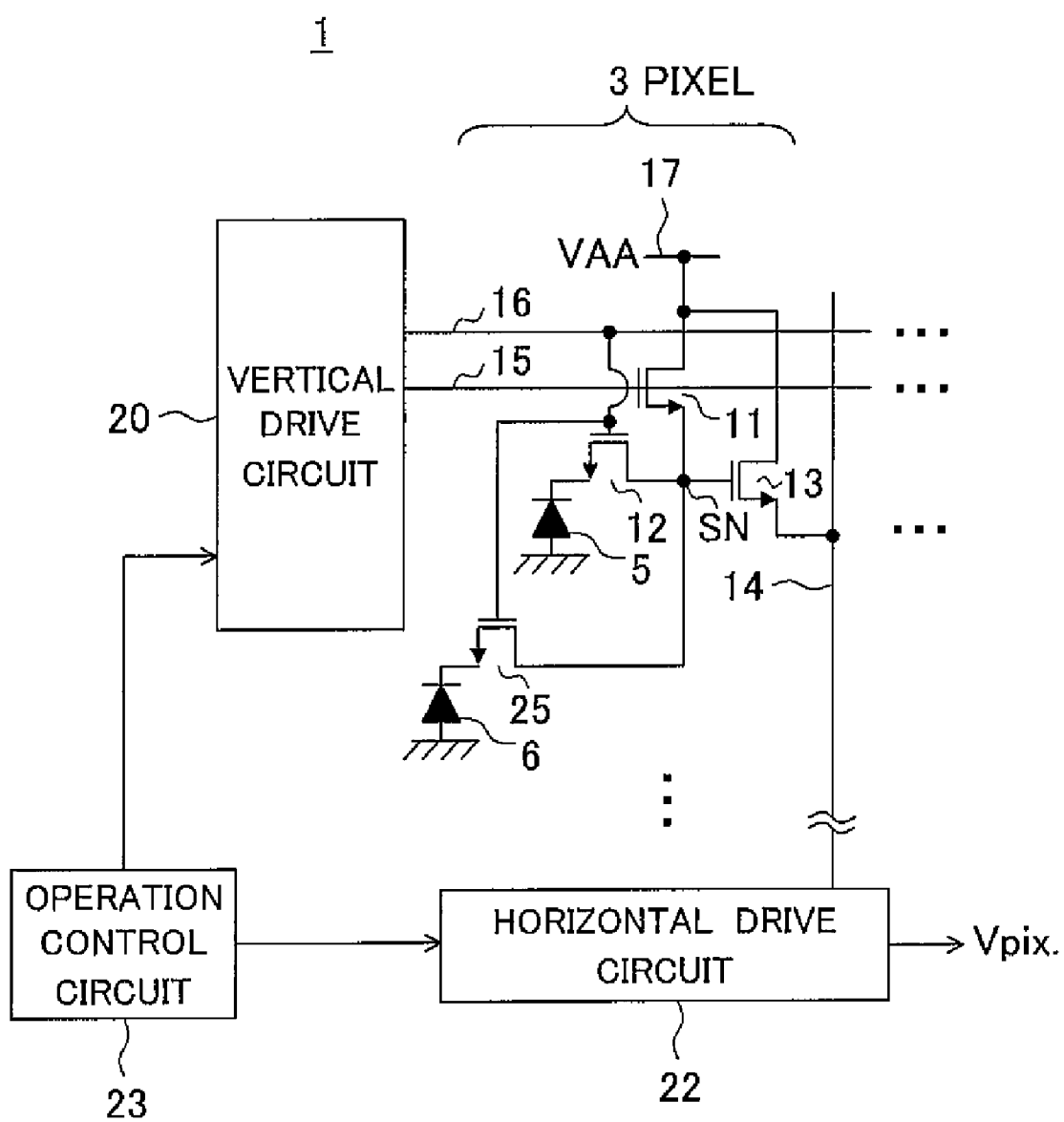
[FIG. 3] Shows a circuit configuration of a pixel of the image sensor of FIG. 1.

FIG. 3 is a diagram showing the circuit configuration of the pixel 3 of the image sensor 1 and a connection relationship with a vertical drive circuit 20 controlling a readout timing of the pixel 3.

The circuit configuration relating to the first photodiode 5 may be a suitable well known configuration. For example, each pixel 3 is provided with a reset transistor 11 switching a storage node SN from a floating state to a connection state to a power source line 17, charging a power supply voltage VAA to the storage node SN, and resetting its stored charge amount, a first transfer transistor 12 transferring a charge (usually electrons, but positive holes are possible too) generated in the first photodiode 5 to the storage node SN which became the floating state again after the reset, and an amplifier transistor 13 connected at its drain to the power source line 17 and amplifying a pixel signal in accordance with the stored charge transferred to the storage node SN and outputting the same to a vertical signal line 14.

The reset transistor 11 is connected at its drain to the power supply line 17, connected at its source to the storage node SN, and connected at its gate to a first control line 15 controlling the application of the voltage. The first transfer transistor 12 is connected at its drain to the storage node SN, connected at its source to a semiconductor impurity region (not shown) forming the cathode of the first photodiode 5, and connected at its gate to a second control line 16 controlling the application of the voltage. The amplifier transistor 13 is connected at its drain to the power supply line 17, connected at its source to the vertical signal line 14, and connected at its gate to the storage node SN.

The vertical drive circuit 20 supplying various voltages to each of the first control line 15 and the second control line 16 is provided at the periphery of the pixel portion. Further, a horizontal drive circuit 22 for processing pixel signals read out to the vertical signal line 14 for the purpose of for example elimination of noise and determining the reference level (clamping) and converting the same to time series signals and reading out the same is provided at the periphery of the pixel portion. Further, an operation control circuit (saturation level control portion) 23 controlling the vertical or horizontal drive circuit is provided in the image sensor 1.

The pixel 3 further has the following configuration in order to add the electric signal of the second photodiode 6 to the electric signal of the first photodiode 5.

Namely, the pixel 3 is provided with a second transfer transistor 25 transferring a charge generated in the second photodiode 6 to the storage node SN which became the floating state again after the reset. The second transfer transistor 25 is connected at its drain to the storage node SN, connected at its source to the semiconductor impurity region (not shown) forming the cathode of the second photodiode 6, and connected at its gate to the second control line 16 controlling the application of the voltage.

The operation of the image sensor 1 having the above configuration will be explained.

In the pixel 3 of the image sensor 1 by turning on the reset transistor 11 and application of the power supply voltage VAA to the storage node SN, the charge stored in the storage node SN is discharged and the pixel is reset. After that, the reset transistor 11 is turned off.

Photo-electric conversion is carried out in the first photodiode 5 and second photodiode 6 and charges are stored in the first photodiode 5 and second photodiode 6 in a state where the first transfer transistor 12 and second transfer transistor 25 are turned off.

Then, when a voltage is applied to the second control line 16, the first transfer transistor 12 and the second transfer transistor 25 are simultaneously turned on, the charges (electric signals) stored in the first photodiode 5 and second photodiode 6 are mixed at the storage node SN, and a voltage fluctuation in accordance with the mixed charges occurs.

Accordingly, the signal level of the electric signal based on the charge generated in the first photodiode 5 is increased so that the higher the signal level of the electric signal based on the charge generated in the second photodiode 6 of the same pixel is, the larger the increase amount is. Note that, the storage node SN functions as an increasing portion adding signal levels of electric signals based on charges generated in a plurality of second light receiving elements to the signal levels of electric signals based on charges generated in a plurality of first light receiving elements of the same pixel.

The voltage fluctuation occurring in the storage node SN is amplified by the amplifier transistor 13 and output to the vertical signal line 14. Electric signals output to a plurality of vertical signal lines 14 are sequentially output by the horizontal drive circuit 22. Due to this, output signals (voltages Vpix) of pixels 3 are obtained.

In the image sensor 1, the operations in the pixels described above are repeated for each frame. An operation control circuit of the image sensor 1 controls the saturation levels of the first photodiodes so that degrees of saturation of charges in the plurality of first photodiodes are kept within a predetermined range in the next frame based on at least one of the electric signals based on charges generated in the first photodiodes 5 and the electric signals based on charges generated in the second photodiodes 6 in one frame.

Figure 4:
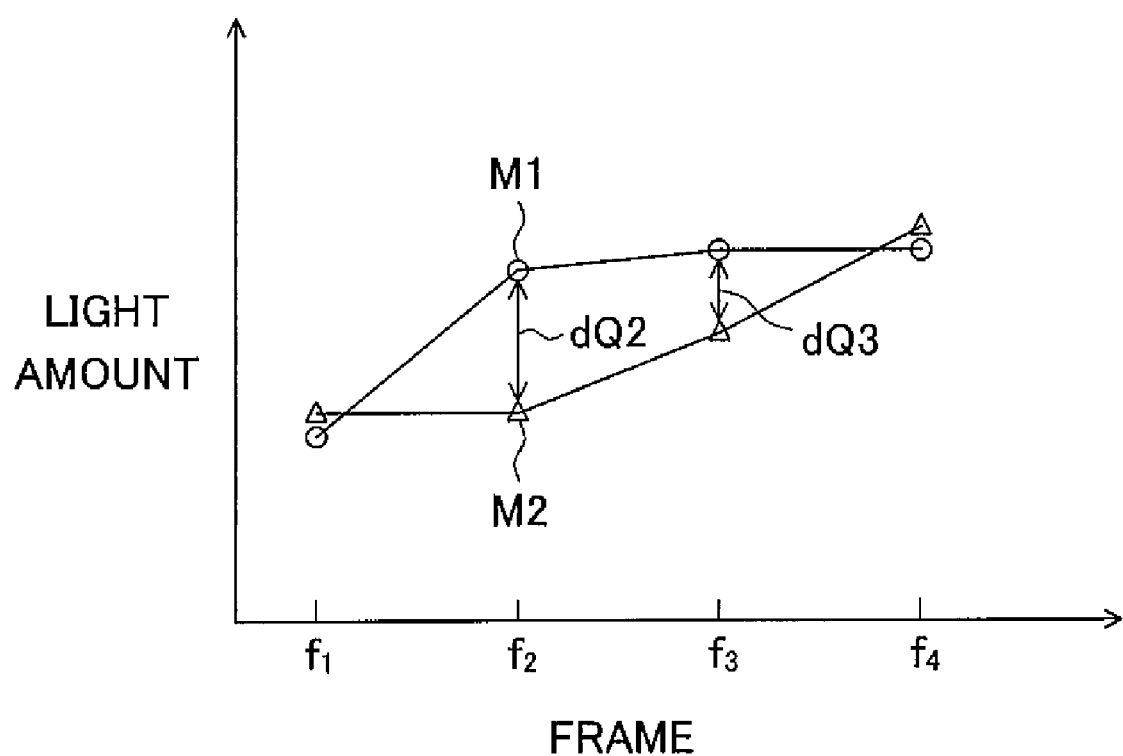
[FIG. 4] A diagram explaining a situation of control of a saturation level in the image sensor of FIG. 1.

FIG. 4 is a diagram explaining the situation of the control of the saturation level in the image sensor 1, in which the abscissa indicates a frame number (time), and the ordinate indicates the light amount. M1 indicates an incident light amount of a pixel 3 in which the incident light amount is the maximum among a plurality of pixels 3 in each frame, and M2 indicates the light amount (saturation level) by which the charge is saturated in the pixel 3. In the following description, an explanation will be given by taking as an example a case where the control is made so that there are no longer any saturated pixels.

In the frame f1, the incident light amount is less than the saturation level. In the frame f2, the incident light amount exceeds the saturation level. Therefore, the operation control circuit 23 relatively raises the saturation level in the next frame f3 with respect to the incident light amount. Note that the pixel 3 in which the incident light amount is the maximum and its incident light amount are specified from the output signal (voltage Vpix) corresponding to each pixel and output from the horizontal drive circuit 22. The rise amount of the saturation level is suitably set in accordance with a light amount dQ2 as a difference between the incident light amount and the saturation level, for example, is set to an amount proportional to the light amount dQ2. The relative rise of the saturation level is obtained by shortening the storage time and lowering the amount of light to be subjected to the photoelectric conversion or raising the power supply voltage VAA applied to the power supply line 17.

In the frame f3, the rise of the saturation level does not sufficiently follow the rise of the incident light amount, so the incident light amount is still over the saturation level. Then, in the next frame f4, the saturation level exceeds the incident light amount. Note that the operation control circuit 23 conversely lowers the saturation level in a case where the saturation level becomes too large with respect to the incident light amount.

According to the above embodiment, provision is made of the second photodiode 6 arranged at a position in the second principal surface S2 side of the first photodiode 5, receiving the light incident upon the first principal surface S1 and passing through at least one of the first photodiode 5 and the substrate 2, and generating a charge in accordance with the amount of light received, and the signal level of the electric signal based on the charge generated in the first photodiode 5 is increased so that the higher the signal level of the electric signal based on the charge generated in the second photodiode 6 of the same pixel is, the larger the increase amount is. Therefore, even in a case where the bright-dark difference within the imaging range is large, an image can be captured with a suitable dynamic range.

Namely, the light incident upon the first principal surface S1 is absorbed by a constant amount by at least one of the first photodiode 5 and the substrate 2, while the remaining light reaches the second photodiode 6. For this reason, even in a region where the charge is saturated in the first photodiode 5 and the distribution of the signal level of the electric signal becomes flat, an electric signal is output with a signal level distribution in accordance with the light amount distribution in the second photodiode 6. Then, by increasing the signal level distribution of the signal of the first photodiode 5 by an increase in accordance with that signal level distribution of the second photodiode 6, the drop of the image quality due to the saturation of the light receiving portion can be prevented while reflecting the real luminance distribution.

The second photodiodes 6 are arranged on the second principal surface S2 of the substrate 2. Therefore, in comparison with a case where the second photodiodes 6 are embedded inside the substrate 2, the mounting onto the substrate 2 is easy and, at the same time, entry of noise into the second photodiodes 6 by a current leaked from the first photodiodes 5 is prevented.

The signal levels of the electric signals of the first photodiodes 5 are increased by adding the electric signals of the second photodiodes 6 to the electric signals of the first photodiodes 5, therefore the configuration is simple.

When controlling the saturation level of a first photodiode 5, a control delay as shown in frames f2 and f3 of FIG. 4 occurs. Conventionally, smear occurred in frames f2 and f3. However, the light amount dQ2 or light amount dQ3 of the difference between the actual incident light amount and the saturation level of the first photodiode 5 occurring due to the control delay is received by the second photodiode 6, an electric signal in accordance with the light amount dQ2 or dQ3 is output, and the electric signal of the first photodiode 5 is increased in accordance with the output of the electric signal, therefore the smear can be prevented. In other words, in a case where the bright-dark difference abruptly changes, an image can be captured with a suitable dynamic range. Accordingly, even in a case where an abrupt bright-dark difference occurs in the imaging range of a vehicular mounted camera when for example an automobile enters into and/or leaves a tunnel, the image can be captured with a suitable dynamic range and the detection of white line etc. can be carried out.

Further, conventionally, in frames f2 and f3, the light amount dQ2 and the light amount dQ3 of the difference between the actual incident light amount and saturation level of the first photodiode 5 occurring due to the control delay could not be identified. It was difficult to properly determine the control amount of the saturation level in the next frames, that is, the frames f3 and f4. In the image sensor 1, however, the light amount dQ2 and light amount dQ3 can be received by the second photodiode 6, therefore the control amount of the saturation level can be properly determined.

Second Embodiment

Figure 5:
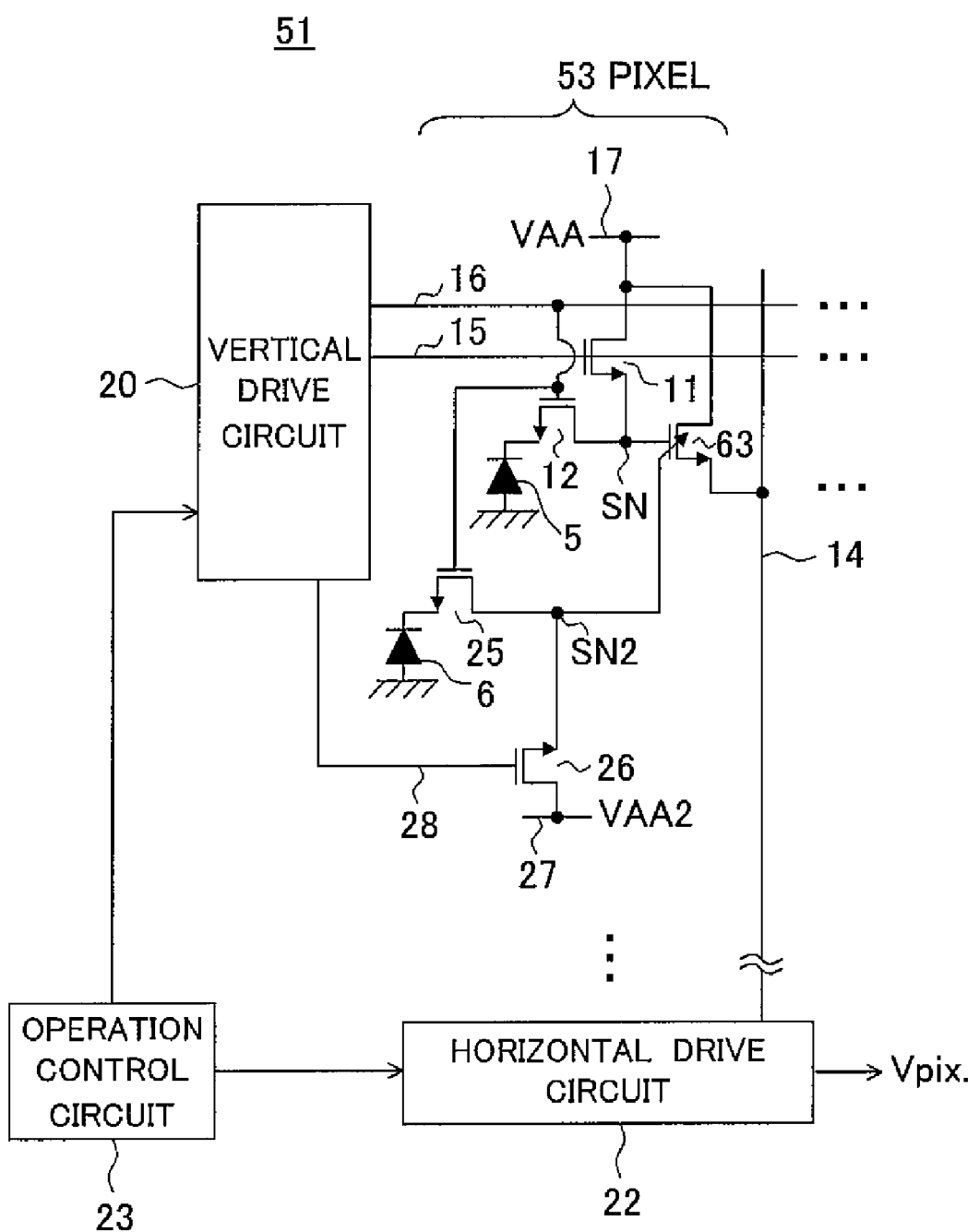
[FIG. 5] A diagram showing a circuit configuration of a pixel of an image sensor of a second embodiment of the present invention.

FIG. 5 is a diagram showing the circuit configuration of a pixel 53 of an image sensor 51 of a second embodiment of the present invention and a connection relationship with the vertical drive circuit 20 controlling the readout timing of the pixel 53. Note that the same configurations as those of the first embodiment are assigned the same notations as those of the first embodiment and explanations will be omitted.

In the second embodiment, the amplification rate when amplifying the electric signal of the first photodiode 5 of the pixel 53 is changed in accordance with the signal level of the electric signal of the second photodiode 6, therefore, the higher the signal level of the electric signal of the second photodiode 6 is, the larger the signal level of the electric signal of the first photodiode 5 of the same pixel 53 is increased to be. Specifically, this is as follows.

In the image sensor 51 of the second embodiment, in place of the amplifier transistor 13 of the image sensor 1 of the first embodiment, an amplifier transistor (amplifier) 63 configured by a variable gain amplifier is arranged. The connections of the drain, source, and gate of the amplifier transistor 63 are the same as those of the first embodiment. In the amplifier transistor 63, for example, the larger the level of the signal applied to the control gate, the larger the amplification rate. The control gate is connected to the drain of the second transfer transistor 25.

Between the control gate of the amplifier transistor 63 and the drain of the second transfer transistor 25, a reset transistor 26 switching a storage node SN2 from the floating state to the connection state with the power supply line 27, charging a power supply voltage VAA2 to the storage node SN2, and resetting its stored charge amount is provided. The reset transistor 26 is connected at its drain to the power supply line 27, connected at its source to the storage node SN2, and connected at its gate to a control line 28 controlling the application of the voltage. Note that, a voltage is applied to the control line 28 by the vertical drive circuit 20 in the same way as the first control line 15.

The operation of the image sensor 51 of the second embodiment described above will be explained.

In the pixel 53 of the image sensor 51, in the same way as the first embodiment, by turning on the reset transistor 11 and applying the power supply voltage VAA to the storage node SN, the charge stored in the storage node SN is discharged, and the pixel is reset. Further, in synchronization with this, by turning on the reset transistor 26 and applying the power supply voltage VAA2 to the storage node SN2, the charge stored in the storage node SN2 is discharged.

The photo-electric conversion is carried out in the first photodiode 5 and second photodiode 6 in the state where the first transfer transistor 12 and second transfer transistor 25 are turned off and charges are stored in the first photodiode 5 and second photodiode 6.

Then, when a voltage is applied to the second control line 16, the first transfer transistor 12 and the second transfer transistor 25 are simultaneously turned on. An electric signal based on the charge stored in the first photodiode 5 is input via the storage node SN to the gate of the amplifier transistor 63 and amplified. At that time, an electric signal based on the charge stored in the second photodiode 6 is input to the control gate of the amplifier transistor 63. The amplification rate changes so that the larger the signal level of the electric signal, the higher the amplification rate.

Accordingly, the signal level of the electric signal based on the charge generated in the first photodiode 5 is increased so that the higher the signal level of the electric signal based on the charge generated in the second photodiode 6 of the same pixel, the larger the increase amount is.

According to the second embodiment described above, the same effects as those by the first embodiment are obtained. Further, as the signal level of the electric signal of the second photodiode 6 becomes larger, the amplification rate when amplifying the electric signal of the first photodiode 5 of the same pixel 53 is made larger, therefore a signal can be corrected when amplifying the electric signal of the first photodiode 5, and the configuration is simple.

Third Embodiment

Figure 6:
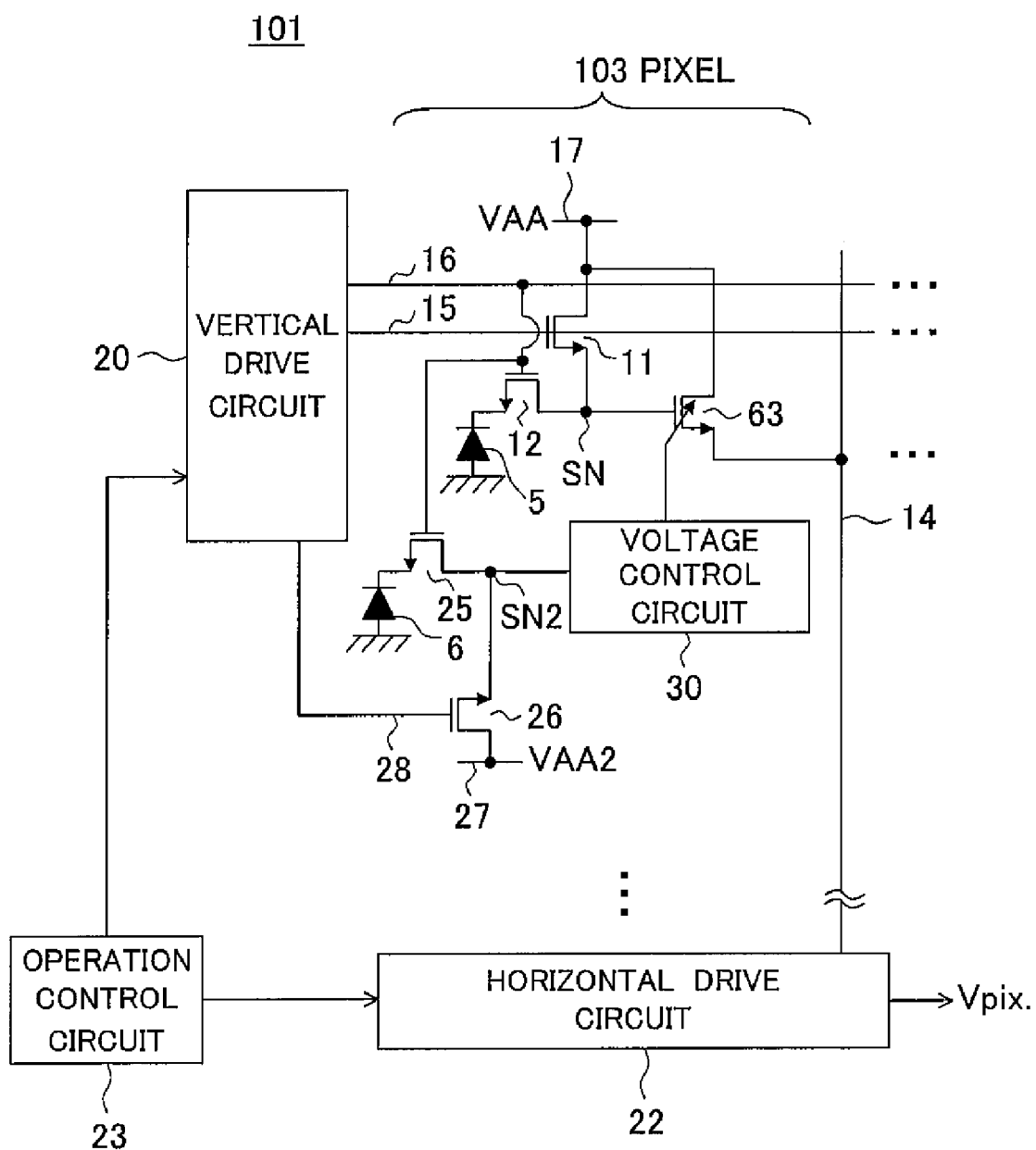
[FIG. 6] A diagram showing a circuit configuration of a pixel of an image sensor of a third embodiment of the present invention.

FIG. 6 is a diagram showing the circuit configuration of a pixel 103 of an image sensor 101 of a third embodiment of the present invention and a connection relationship with the vertical drive circuit 20 controlling the readout timing of the pixel 103. Note that configurations the same as those of the first and second embodiments are assigned the same notations as those of the first and second embodiments, and explanations will be omitted.

In the third embodiment, in addition to the configuration the same as that of the second embodiment, a voltage control circuit (increase control portion and signal level conversion portion) 30 is provided between the storage node SN2 and the control gate of the amplifier transistor 63. The voltage control circuit 30 may be provided for each pixel as well, one voltage control circuit (for example one for each vertical signal line 14) may be provided for a plurality of pixels as well, or one may be provided with respect to all pixels. Note that the operation of the image sensor 101 of the third embodiment is the same as that of the second embodiment except for the operation of the voltage control circuit 30.

The voltage control circuit 30 converts the signal level (voltage) of the electric signal input from the storage node SN2 and outputs the result. For example, the voltage control circuit 30 performs various processing based on the electric signal of the second photodiode 6 and outputs an electric signal of a signal level in accordance with the processing results so that electric signal of the first photodiode 5 is amplified while being more preferably corrected.

For example, in FIG. 2, for simplifying the explanation, a case where the amount of light which was not reflected in the electric signal by the first photodiode 5 is converted to an electric signal as it is by the second photodiode 6 is exemplified. Namely, the saturation level indicated by the solid line L2 and the level of the amount of light absorbed by the first photodiode 5 and substrate 2, which is indicated by the solid line L4, are approximately the same and, at the same time, the range of x1 to x2 and the range of x1' to x2' become approximately the same.

However, it is troublesome to set the photo-electric conversion rate of the first photodiode 5, its transmission rate, the photo-electric conversion rate of the second photodiode 6, and the transmission rate of the substrate 2 interposed between the first photodiode 5 and second photodiode 6 so that such relationships stand.

Therefore, these settings are moderately set in advance and, in place of that, experiments etc. are used to identify the correlation among the amount of the light actually incident upon the first principal surface S1, the signal level of the electric signal output from the first photodiode 5, and the signal level of the electric signal output from the second photodiode 6. Based on the correlation, data showing the relationship between the signal level of the output signal of the second photodiode 6 and the amplification rate for preferably amplifying the electric signal of the saturation level of the first photodiode 5 is prepared and stored in the voltage control circuit 30. By the voltage control circuit 30 applying the voltage corresponding to the output signal of the second photodiode 6 to the gate voltage of the amplifier transistor 63 based on the related data, the electric signal of the first photodiode 5 is preferably amplified.

Note that when the processing etc. in the voltage control circuit 30 causes the timing when the output signal of the second photodiode 6 is output to the control gate of the amplifier transistor 63 to be delayed with respect to the timing when the output signal of the first photodiode 5 is output to the amplifier transistor 63, these may be synchronized by a suitable method such as buffering the output signal of the first photodiode 5.

According to the third embodiment described above, it becomes possible to amplify the signal of the first photodiode 5 with a more preferred amplification rate in comparison with the second embodiment.

Fourth Embodiment

Figure 7:
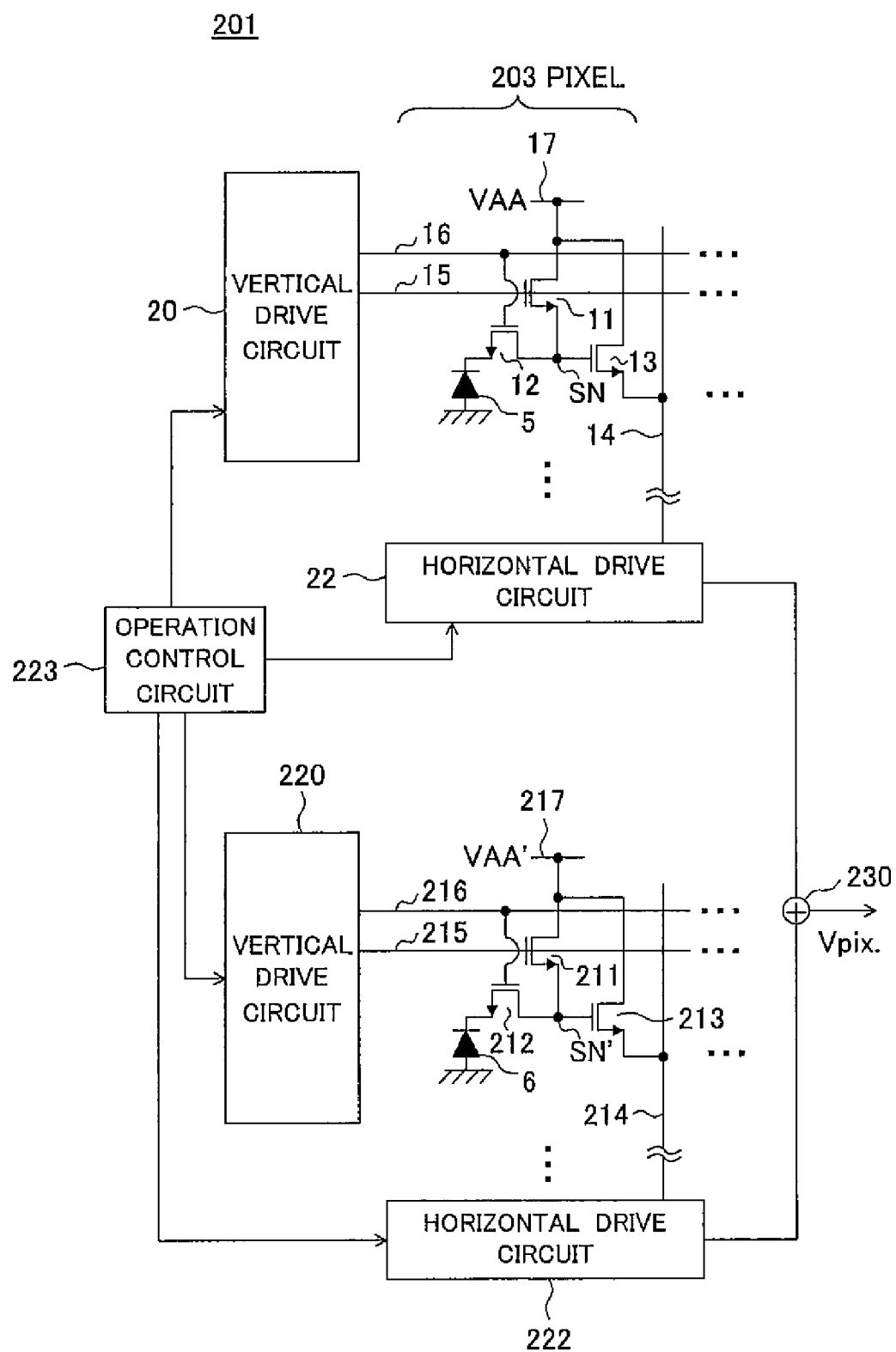
[FIG. 7] A diagram showing a circuit configuration of a pixel of an image sensor of a fourth embodiment of the present invention.

FIG. 7 is a diagram showing the circuit configuration of a pixel 203 of an image sensor 201 of a fourth embodiment of the present invention and a connection relationship with the vertical drive circuit 20 etc. controlling the readout timing of the pixel 203. Note that configurations the same as those of the first to third embodiments are assigned the same notations as those of the first to third embodiments, and explanations will be omitted.

In the fourth embodiment, the circuit configuration relating to the first photodiode 5 (upper portion of the sheet surface) and the circuit configuration relating to the second photodiode 6 (lower portion of the sheet surface) are configured in the same way. The on/off timing of the reset transistor 11 and transfer transistor 12 relating to the first photodiode 5 and the on/off timing of a reset transistor 211 and a transfer transistor 212 relating to the second photodiode 6 of the same pixel are synchronized by an operation control circuit 223.

Then, by addition of the output signal from the horizontal drive circuit corresponding to the first photodiode 5 and the output signal from the horizontal drive circuit corresponding to the second photodiode 6 at an adder portion 230, the signal level of the electric signal of the first photodiode 5 increases in accordance with the signal level of the electric signal of the second photodiode 6. Note that the adder portion 230 may suitably correct the electric signal from the second photodiode 6 and then add the same to the electric signal of the first photodiode 5 as well as in the voltage control portion 30 of the third embodiment.

According to the fourth embodiment described above, the circuit configuration relating to the second photodiode 6 can be made the same as the conventional circuit configuration. Further, production is possible by substantially the same production process as that for the first photodiode 5, therefore the production cost is reduced.

Fifth Embodiment

Figure 8:
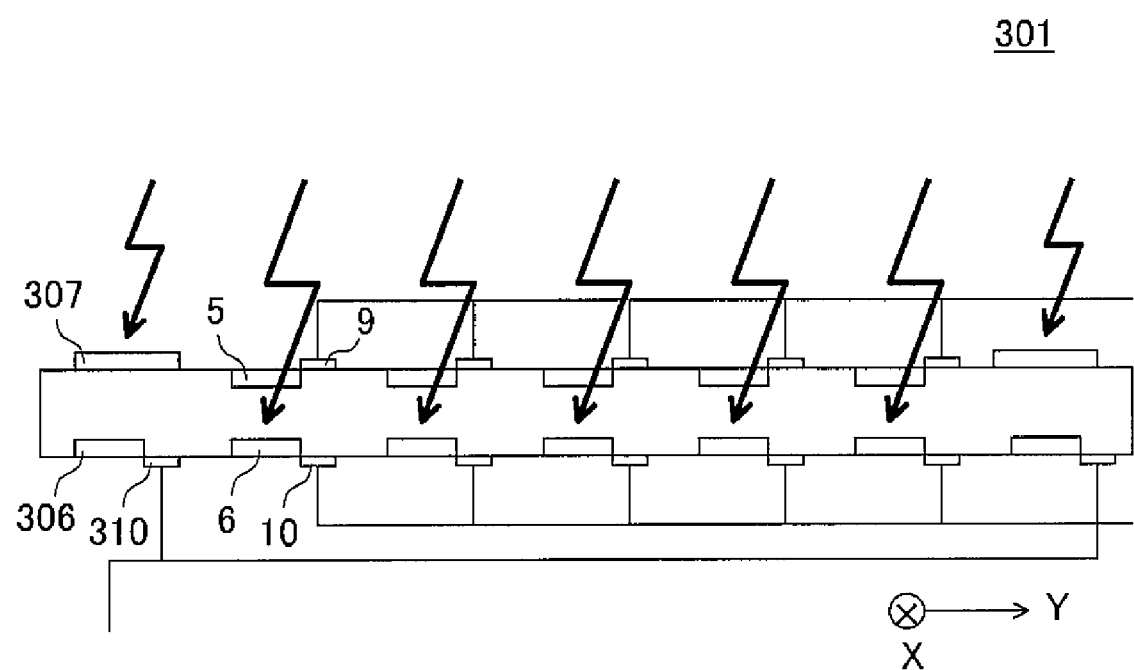
[FIG. 8] A cross-sectional view schematically showing an image sensor of a fifth embodiment of the present invention.

FIG. 8 is a cross-sectional view schematically showing an image sensor 301 of a fifth embodiment of the present invention. Note that the same configurations as those of the first to fourth embodiments are assigned the same notations as those of the first to fourth embodiments, and explanations will be omitted.

The image sensor 301 of the fifth embodiment is characterized in that an influence of a dark current of the second photodiode 6 is eliminated. It is provided with a third photodiode 306 for measuring the dark current and a shading portion 307 shading the third photodiode 306.

The third photodiode 306 is for example a photodiode having the same configuration as that of the second photodiode 6, that is, a photodiode made by the same material in the same shape. Further, the third photodiode 306 is arranged on the same plane as that for the second photodiode 6. Namely, it is provided on the second principal surface S2. Further, a configuration for outputting the electric signal from the third photodiode 306 to a third electrode 310 is the same as the configuration for outputting the electric signal from the second photodiode 6 to the second electrode 10 as well.

The shading portion 307 is formed by a material having no light transmission property, is arranged on the first principal surface S1, and blocks the light going toward the third photodiode 306 from the first principal surface S1 side. The shading portion 307 is for example a metal film made of aluminum etc. Note that, between the third photodiode 306 and the shading portion 307, a photodiode for measuring the dark current of the first photodiode 5 may be provided or may not be provided.

Figure 9A:
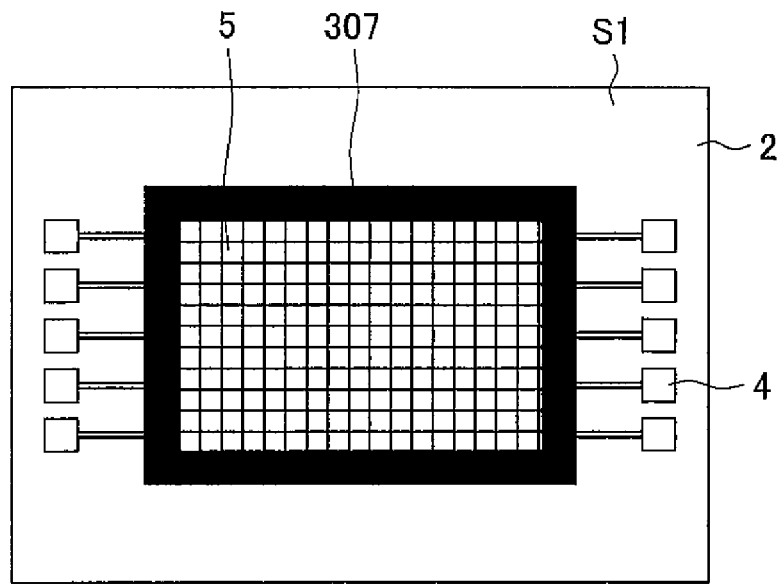
[FIG. 9] Plan views schematically showing the image sensor of FIG. 8.
Figure 9B:
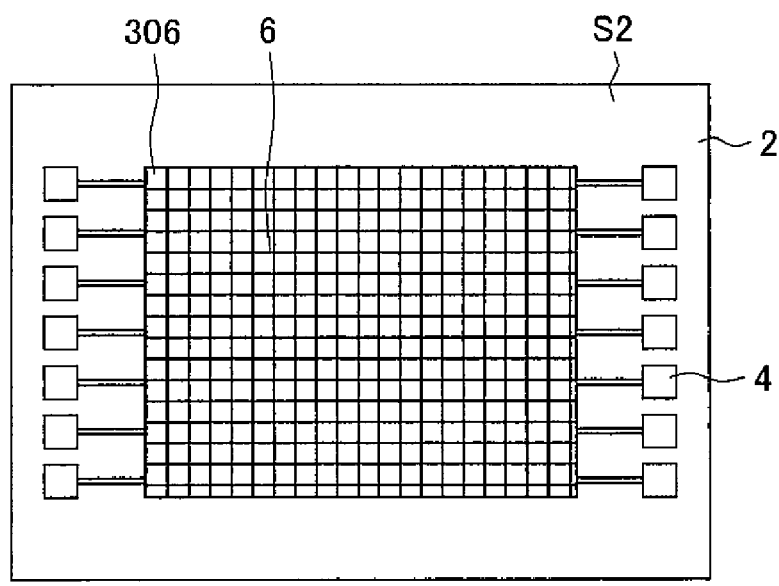

FIG. 9 are plan views schematically showing the image sensor 301, in which FIG. 9A shows the first principal surface S1, and FIG. 9B shows the second principal surface S2. The third photodiode 306 and shading portion 307 are provided over the periphery of the region of arrangement of the first photodiode 5 and second photodiode 6. Note that, on the two ends of the substrate 2, a plurality of signal output terminals 4 for outputting signals output from the horizontal drive circuit 22 to the outside are provided.

Figure 10:
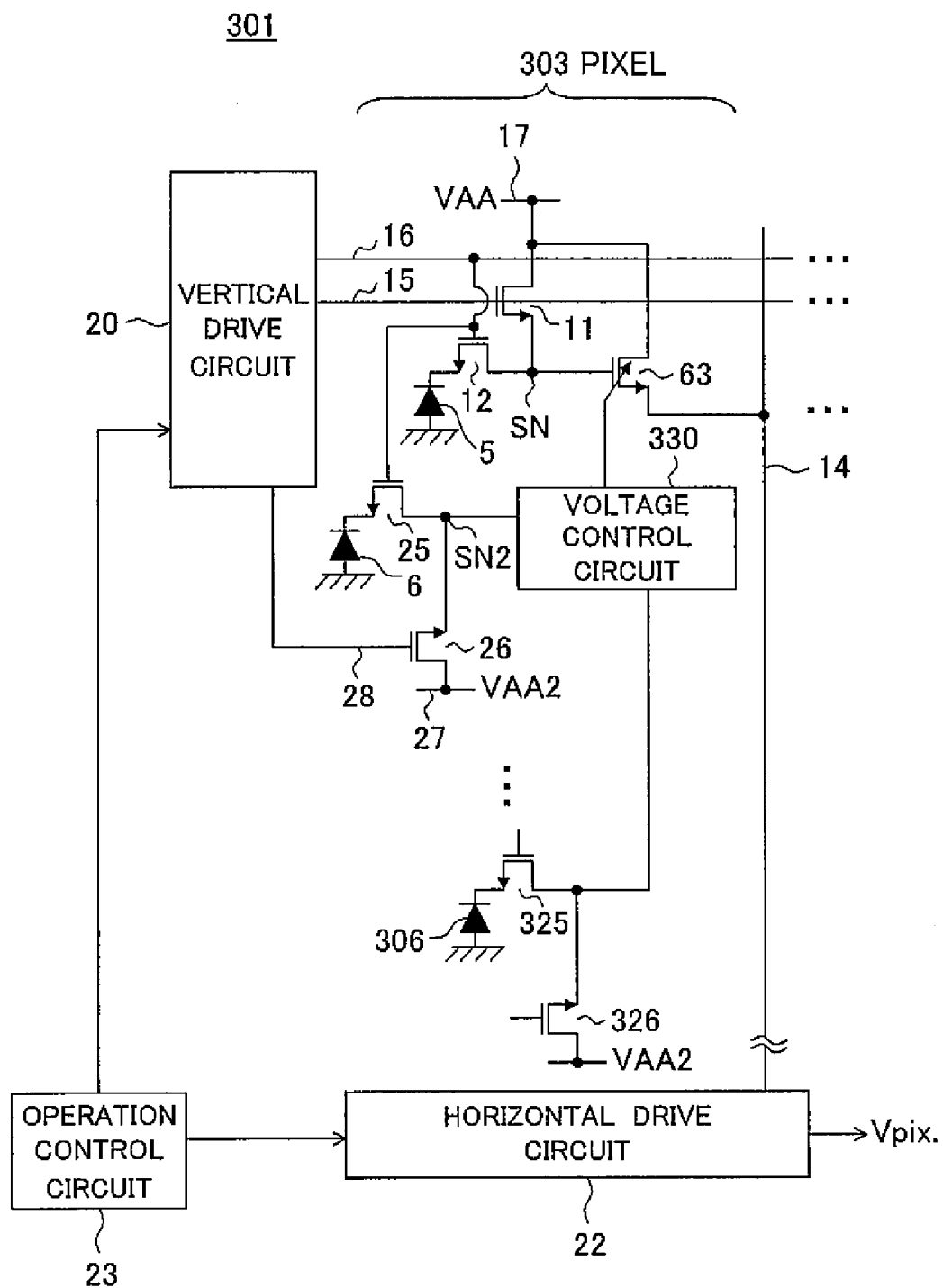
[FIG. 10] A diagram showing the circuit configuration of the pixel of the image sensor of FIG. 8.

FIG. 10 is a diagram showing the circuit configuration of the image sensor 301. The image sensor 301 is provided with, in addition to the same circuit configurations as those of the first to fourth embodiments explained above, a circuit correcting the electric signal of the second photodiode 6 based on the electric signal output from the third photodiode 306.

For example, the image sensor 301 is provided with the same configurations as those of the second embodiment concerning the first photodiode 5 and the second photodiode 6. Further, the image sensor 301, relating to the third photodiode 306, is provided with a transfer transistor 325 and a reset transistor 326 in the same way as the second photodiode 6. The charge of the third photodiode is stored for a storage time having the same length as that of the second photodiode 6. An electric signal based on the charge of the third photodiode 306 is output to a voltage control circuit 330. The voltage control circuit 330 corrects the electric signal from the second photodiode 6 based on the signal level of the electric signal from the third photodiode 306. For example, the signal level of the electric signal of the third photodiode 306 is subtracted from the signal level of the electric signal from the second photodiode 6 and the result output.

Note that the voltage control circuit 330, for example, stores the signal level of the electric signal from the third photodiodes 306, reads out the signal level of the electric signal of the third photodiode 330 at the position near the second photodiode 6 to be corrected and corrects the signal level of the electric signal of the second photodiode based on the read out signal level, and otherwise utilizes the electric signal of the third photodiode 306 at a suitable position at a suitable timing.

According to the fifth embodiment described above, the influence of the dark current of the second photodiode 6 can be eliminated. Therefore, when correcting the signal level distribution of the electric signal of the first photodiode 5 based on the signal level distribution of the electric signal of the second photodiode 6, the light amount distribution can be made to approach the actual light amount distribution more correctly.

Sixth Embodiment

Figure 11A:
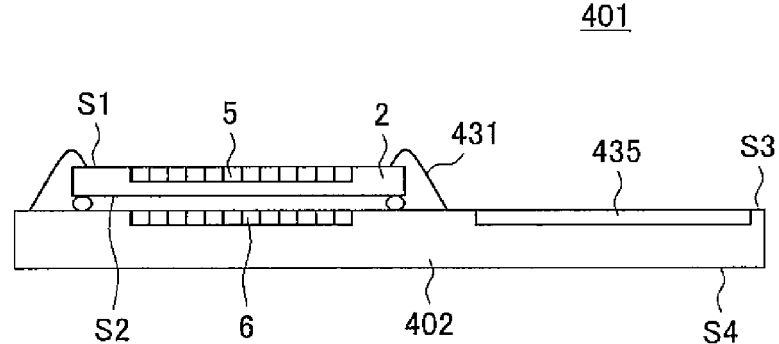
[FIG. 11] A cross-sectional view and a plan view schematically showing an image sensor of a sixth embodiment of the present invention.
Figure 11B:
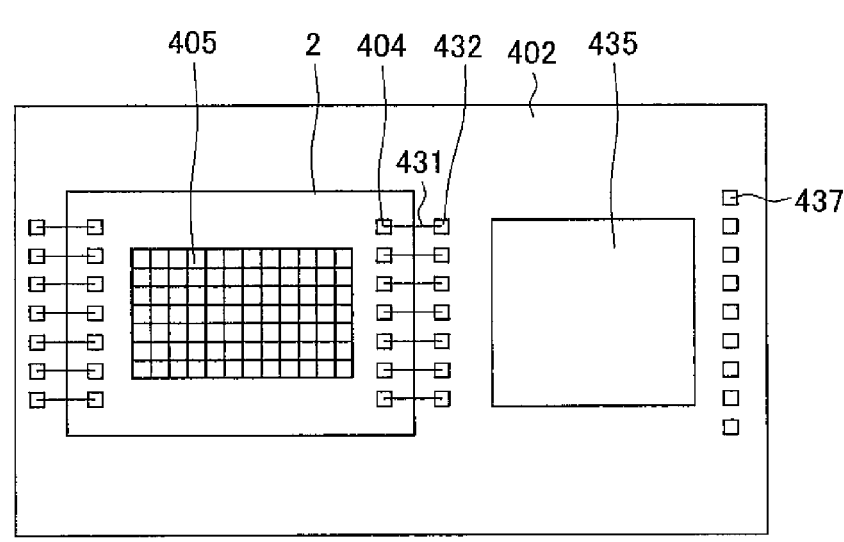

FIG. 11A is a cross-sectional view schematically showing an image sensor 401 of a sixth embodiment of the present invention, and FIG. 11B is a plan view when viewing the image sensor 401 from an object side. Note that configurations the same as those of the first to fifth embodiments are assigned the same notations as those of the first to fifth embodiments, and explanations will be omitted.

The image sensor 401 is provided with a second substrate 402 arranged facing the second principal surface S2 of the substrate 2. The second photodiodes 6 are arranged on a third principal surface S3 facing the second principal surface S2 of the substrate 2 in the second substrate 402. Note that in the same way as the first embodiment, the second photodiodes 6 are provided just beneath the first photodiodes 5.

The substrate 2 and the second substrate 402 are jointed together by solder balls, an insulating bond, or other suitable joint means. The light incident property upon the second substrate 402 may be increased by making the substrate 2 thinner by for example polishing it by about 100 microns. The electric signals of the first photodiodes 5 for example are output from signal output terminals 404 formed in an end portion of the substrate 2 and input via wires 431 formed by metal wire bonding by Au, Al, or the like to signal input terminals 432 formed on the second substrate 402.

The second substrate 402 is formed broader than the substrate 2. A signal processing portion 435 is formed outside of the region of arrangement of the substrate 2 in the third principal surface S3 of the second substrate 402. The signal processing portion 435 executes the processing etc. of electric signals from the first photodiodes 5 and second photodiodes 6 and outputs signals after the processing from external takeout terminals 437 formed in the end portion of the third principal surface S3 of the second substrate 402.

The circuit configuration of each pixel of the image sensor 401 is for example the same as that of the fourth embodiment shown in FIG. 7. The circuit relating to the first photodiode 5 (upper portion of the sheet surface of FIG. 7) is provided on the substrate 2, and the circuit relating to the second photodiode 6 (lower portion of the sheet surface of FIG. 7) is provided on the second substrate 402. The operation control circuit 223 and adder portion 230 are provided on for example the second substrate 402, and the adder portion 230 is included in the signal processing portion 435. Note that, by the formation of the adder portion 230 in the signal processing portion 435, at least a portion of the increasing portion will be provided on the second substrate 402.

Further, in the circuit configuration of the pixel of the image sensor 401, in place of for example the adder portion 230 of FIG. 7, the voltage control circuit 30 and the amplifier transistor 63 configured by a variable gain amplifier shown in FIG. 6 are provided. The voltage control circuit 30 and amplifier transistor 63 may be provided in the signal processing portion 435 as well. In this case, by the voltage control circuit 30 being included in the signal processing portion 435, at least a portion of the increase control portion controlling the operation of the increase portion will be provided on the second substrate 402.

According to the sixth embodiment described above, processing becomes easier in comparison with the case where the first photodiodes 5 and the second photodiodes 6 are provided on the front and back of one substrate. This is because the processing for providing the photodiodes etc. on one principal surface is applied on one substrate, so the conventional production process can be utilized as it is, positioning of the first photodiodes 5 and the second photodiodes 6 may be carried out by positioning of the substrate 2 and the second substrate 402, and so on.

Further, the adder portion 230, amplifier transistor 63, and voltage control circuit 30 can be provided on the second substrate 402, that is, at least a portion of the increasing portion or at least a portion of the increase control portion controlling the operation of the increasing portion can be provided on the second substrate 402, therefore the degree of freedom of a design is improved.

Seventh Embodiment

Figure 12:
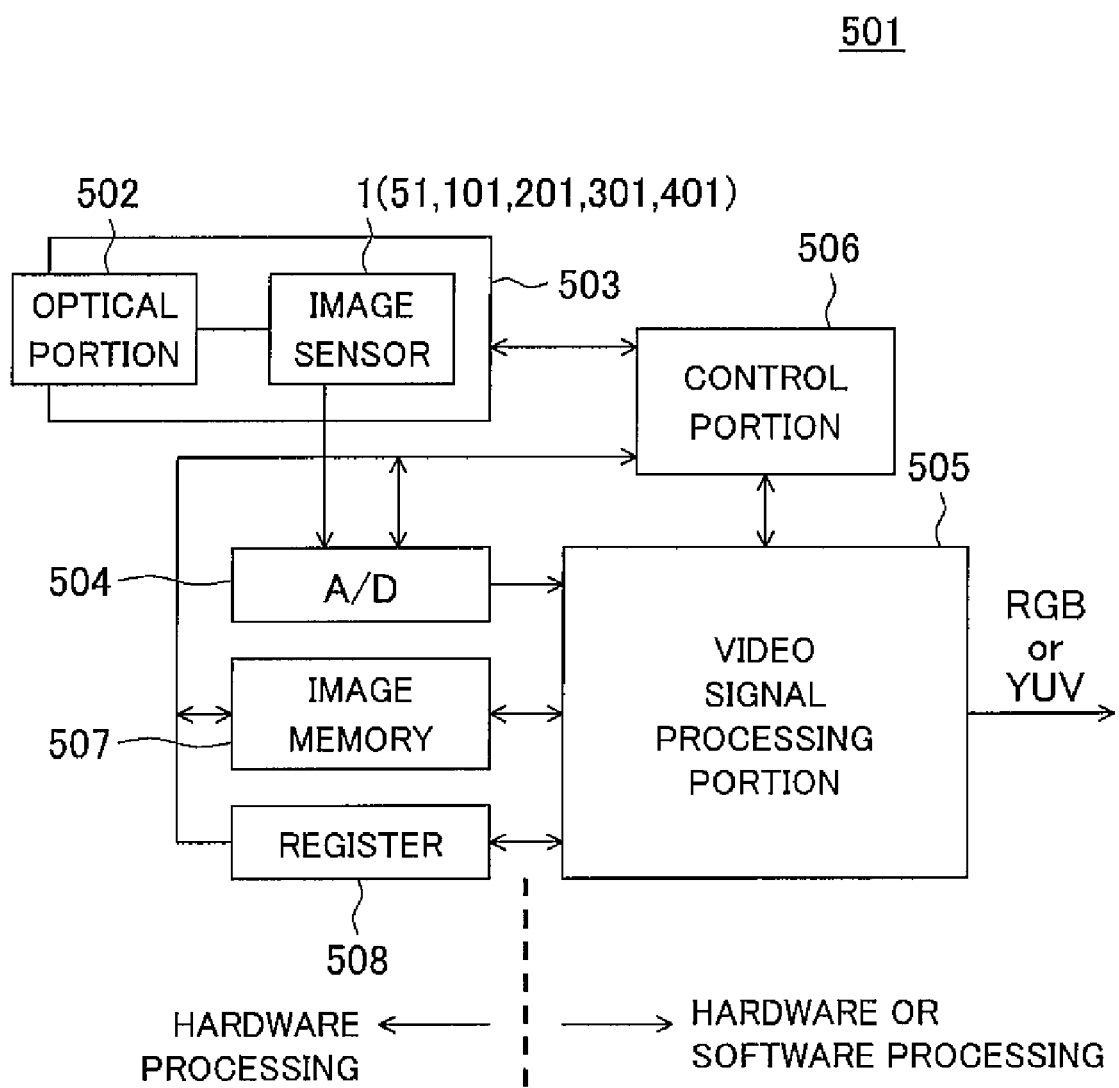
[FIG. 12] A block diagram showing the basic configuration of a camera module of a seventh embodiment of the present invention.

FIG. 12 is a block diagram showing the basic configuration of a camera module 501 of a seventh embodiment. The camera module 501 is used for a suitable application such as a camera mounted on a vehicle, a camera for a mobile phone, etc. and is provided with any of the image sensors 1, 51, 101, 201, 301, and 401 of the first to sixth embodiments (hereinafter, the image sensor 1 will be shown as a representative case).

The camera module 501 has an imaging portion 503 provided with an image sensor 1 and optical portion 502 including a group of lenses, an A/D conversion portion 504 converting a signal from the image sensor 1 to a digital signal, a video signal processing portion 505 applying various processing to the digital signal after the A/D conversion, an image memory 507 storing video signals in units of for example 1 frame or 1 field for the video signal processing, a register 508 holding various types of parameters required for the video signal processing, and a control portion 506 controlling the other portions.

The video signal processing portion 505 performs, as various processing, for example white balance adjustment, interpolation processing, and γ processing and outputs an image after processing as RGB or YUV image signals. Alternatively, in a case where the camera module 501 is configured for mounting on a vehicle, the video signal processing portion 505 detects the white line of a road and detects obstacles based on signals from the imaging portion 503.

Note that, part or all of the signal processing and control explained as executed in the image sensors of the first to sixth embodiments can be shared by the control portion 506 and the video signal processing portion 505 of the camera module 501.

Eighth Embodiment

Figure 13:
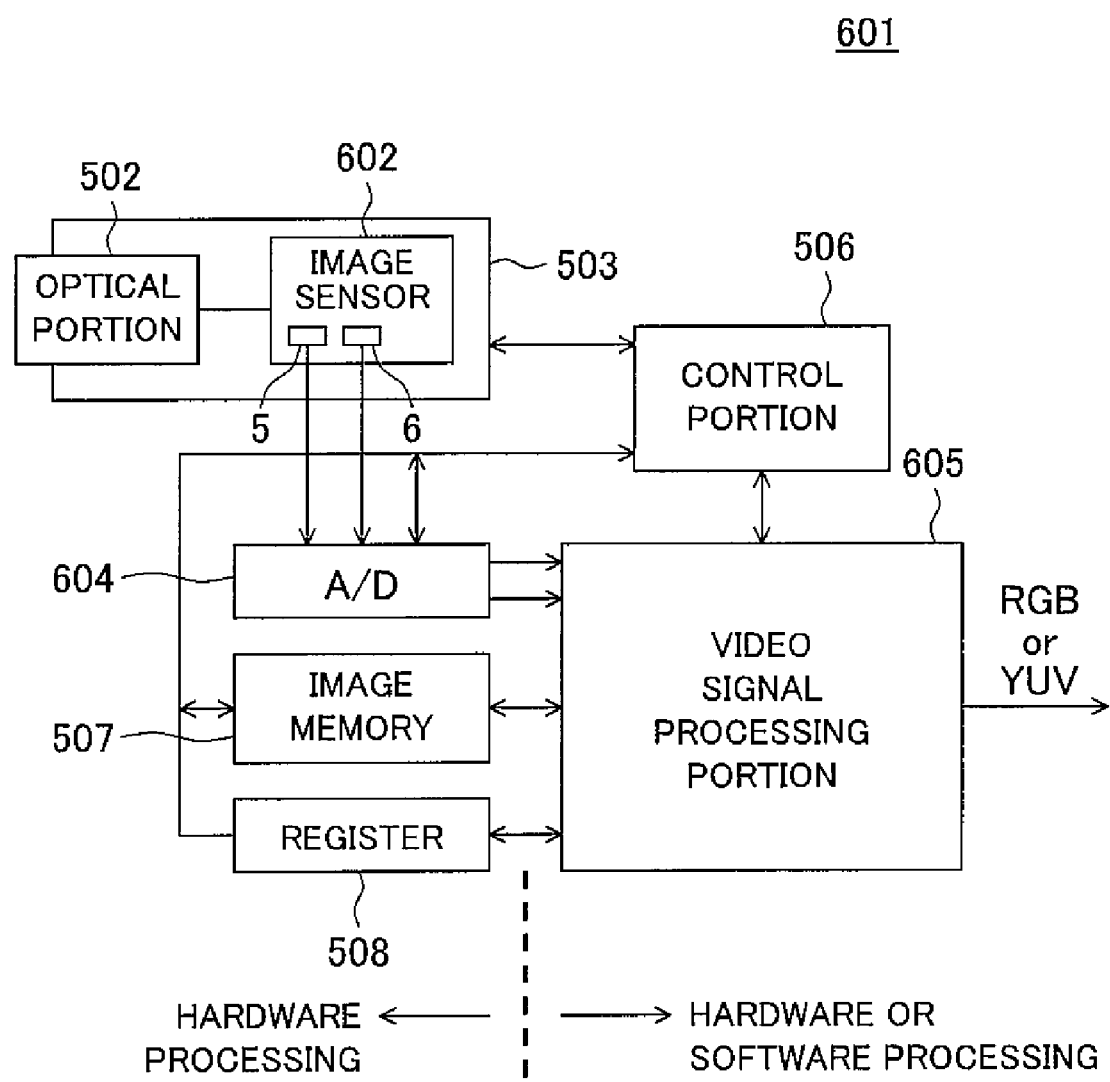
[FIG. 13] A block diagram showing the basic configuration of a camera module of an eighth embodiment of the present invention.

FIG. 13 is a block diagram showing the basic configuration of a camera module 601 of an eighth embodiment. Note that configurations the same as those of the seventh embodiment are assigned the same notations, and explanations will be omitted.

An image sensor 602 of the camera module 601 is configured in substantially the same way as for example the image sensor 201 shown in FIG. 7. Note that the image sensor 602 is not provided with the adder portion 230. A video signal processing portion 605 functions as the adder portion 230 of FIG. 7. Namely, the electric signal of the first photodiode 5 and the electric signal of the second photodiode 6 are separately output to an A/D conversion portion 604 and A/D converted and output to the video signal processing portion 605. Then, the video signal processing portion 605 increases the signal level of the electric signal generated at the first photodiode 5 in accordance with the signal level of the electric signal generated at the second photodiode 6 by performing processing for addition of the digital signal based on the charge generated at the first photodiode 5 and the digital signal based on the charge generated at the second photodiode 6.

Note that, in the eighth embodiment, an explanation was given by assuming that the signal output from the image sensor 602 was increased by the video signal processing portion 605 provided at the outside of the image sensor 602, but it is also possible to consider the video signal processing portion 605 as the increasing portion of the image sensor of the present invention, in other words, define the image sensor including the video signal processing portion 605.

Ninth Embodiment

Figure 14:
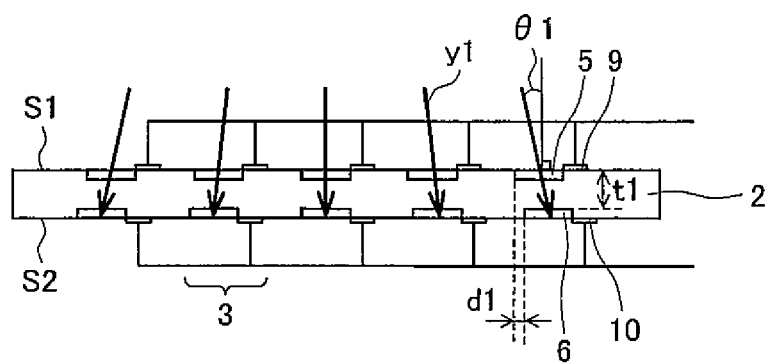
[FIG. 14] A cross-sectional view schematically showing an image sensor of a ninth embodiment of the present invention.

FIG. 14 is a cross-sectional view schematically showing an image sensor 701 of a ninth embodiment of the present invention. Note that the configurations the same as those of the first to eighth embodiments are assigned the same notations as those of the first to eighth embodiments, and explanations will be omitted.

The image sensor 701 of the ninth embodiment has the same configuration as that of the first embodiment in the point that the first photodiodes 5 are provided on the first principal surface S1 of the substrate 2 and the second photodiodes 6 are provided on the second principal surface S2 of the substrate 2. However, the ninth embodiment differs in configuration from the first embodiment in the point that the more the pixels 3 to the outer circumferential side of the pixel array region, the more the second photodiodes 6 are shifted to the outer circumferential side with respect to the first photodiodes 5. Note that the pixel array region is a region in which all pixels 3 are arranged.

In general, the image sensor is arranged so that the center of the pixel array region and the optical axis of the lens and/or the center of a stop schematically coincide with each other. Accordingly, an incident light beam passing through the lens and/or stop and incident upon the image sensor almost vertically strikes the first principal surface S1 at the center of the pixel array region. However, on the outer circumferential side of the pixel array region, this light beam strikes obliquely at an incident angle θ1 so as to go toward the outer circumferential side from the center side of the pixel array region.

Therefore, by arranging the elements so that the more the pixels 3 to the outer circumferential side of the pixel array region, the more the second photodiodes 6 are shifted to the outer circumferential side with respect to the first photodiodes 5, in other words, by arranging them so that the more the pixels 3 are positioned away from the optical axis of the lens and/or the center of the stop, the more the second photodiodes 6 are shifted in the direction away from the optical axis of the lens and/or the center of the stop with respect to the first photodiodes 5, the light passing through the first photodiodes 5 can be made to be correctly received at the second photodiodes 6.

Preferably, a deviation d1 between each first photodiode 5 and second photodiode 6 is set so that d1 becomes equal to t1×tan θ1 where a distance between the first photodiode 5 and the second photodiode 6 is t1. For example, where θ1=15° and t1=50 μm, the deviation d1 between the first photodiode 5 and the second photodiode 6 becomes 13.4 μm. Note that the incident angle θ1 is for example 30° at the maximum.

Note that, needless to say, the configuration of shifting the position of the second photodiode 6 with respect to the first photodiode 5 as in the ninth embodiment can be applied to the image sensors of the first to sixth embodiments as well and that such image sensors can be applied to the image sensors of the camera modules of the seventh and eighth embodiments as well.

10th Embodiment

Figure 15:
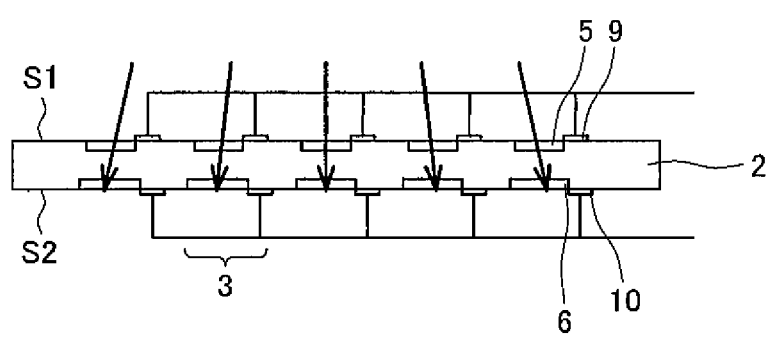
[FIG. 15] A cross-sectional view schematically showing an image sensor of a tenth embodiment of the present invention.

FIG. 15 is a cross-sectional view schematically showing an image sensor 711 of a 10th embodiment of the present invention. Note that configurations the same as those of the first to ninth embodiments are assigned the same notations as those of the first to ninth embodiments, and explanations will be omitted.

The image sensor 711 has the same configuration as that of the first embodiment in the point that the first photodiodes 5 are provided on the first principal surface S1 of the substrate 2, and the second photodiodes 6 are provided on the second principal surface S2 of the substrate 2. However, the 10th embodiment differs in configuration from the first embodiment in the point that the light receiving area of each second photodiode 6 is broader than the light receiving area of the first photodiode 5. Note that the light receiving area is the area of a surface receiving the light incident from the first principal surface S1 in order to perform the photo-electric conversion and is substantially equivalent to a projection area of each photodiode onto the first principal surface S1.

Each first photodiode 5 and second photodiode 6 are arranged so that for example their centers schematically coincide. Further, the second photodiode 6 projects to the outer circumferential side of the pixel array region with respect to the first photodiode by the amount of the area of the second photodiode 6 broader than the first photodiode 5.

In the 10th embodiment, in the same way as the ninth embodiment, the light incident at the incident angle θ1 and passing through each first photodiode 5 is kept from striking a region in which the second photodiode 6 is not arranged. Further, the light beam focused at the first photodiode 5 advances while radially spreading after passing through the first photodiode 5, so the cross section must become larger. However, by making the light receiving area of the second photodiode 6 broader than the light receiving area of the first photodiode, the light beam passing through the first photodiode 5 can be received while further preventing leakage.

Note that, needless to say, the configuration for making the light receiving area of the second photodiode 6 broader than the light receiving area of the first photodiode 5 and making the second photodiode 6 project to the outer circumferential side of the pixel array region with respect to the first photodiode 5 as in the 10th embodiment can be applied to image sensors of the first to sixth and ninth embodiments as well and such image sensors can be applied to the image sensors of the camera modules of the seventh and eighth embodiments as well.

11th Embodiment

Figure 16:
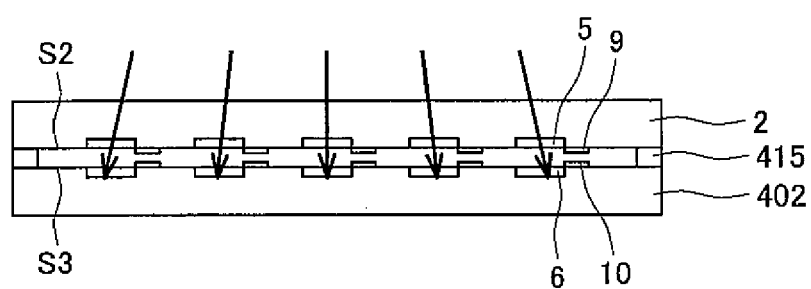
[FIG. 16] A cross-sectional view schematically showing an image sensor of an eleventh embodiment of the present invention.

FIG. 16 is a cross-sectional view schematically showing an image sensor 721 of an 11th embodiment of the present invention. Note that configurations the same as those of the first to 10th embodiments are assigned the same notations as those of the first to 10th embodiments, and explanations will be omitted.

In the 11th embodiment, in the same way as the sixth embodiment, the image sensor 721 has the second substrate 402 arranged facing the second principal surface S2 of the substrate 2, and second photodiodes 6 are arranged on the third principal surface S3 facing the second principal surface S2 of the substrate 2 in the second substrate 402. Also, the circuit configuration is the same as that of the sixth embodiment. However, the 11th embodiment differs from the sixth embodiment in the point that the first photodiode 5 is arranged on the second principal surface S2 of the substrate 2. Note that the second photodiodes 6 are arranged for example just beneath the first photodiodes 5, and light receiving areas of the first photodiodes 5 and the second photodiodes 6 are equivalent.

The second principal surface S2 and the third principal surface S3 face each other while sandwiching a plurality of spacers 415 therebetween. The spacers 415 are for example solder bumps and keep the second principal surface S2 and the third principal surface S3 at a predetermined interval. The interval between the second principal surface S2 and the third principal surface S3 is for example 10 μm or less.

According to the 11th embodiment, by making the interval between the second principal surface S2 and the third principal surface S3 small, the deviation of the light incident upon the first principal surface S1 at the incident angle θ1 and passing through the first photodiode 5 with respect to the second photodiode 6 can be suppressed.

Further, the light received by each first photodiode 5 is passed through the substrate 2 made of silicon as a principal material, therefore visible rays are cut off. Most of the remaining light is the light in the infrared ray region. For this reason, the image sensor 721 can be preferably used for an infrared camera, an infrared sensor, etc.

Note that, needless to say, the image sensor 721 of the 11th embodiment can be applied to the image sensors of the camera modules of the seventh and eighth embodiments as well, in the image sensor 721 of the 11th embodiment, the position of each second photodiode 6 may be shifted from the first photodiode 5 as in the ninth embodiment, or the light receiving area of each second photodiode 6 may be made broader than the light receiving area of the fifth photodiode 5 as in the 10th embodiment.

The present invention is not limited to the above embodiments and can be carried out in various ways.

The image sensor may be a MOS type or other type of the XY address system or a CCD or other type of a charge transfer system. Further, in the case of the XY address system, the embodiments disclosed so-called amplification type image sensors where an amplifier was provided for each pixel, but one amplifier may be provided for all pixels or part of the pixels in the image sensor as well. The configurations of the first to eighth embodiments may be suitably combined.

For example, in the fourth embodiment shown in FIG. 7, the amplifier transistors 13 and 213 may be omitted and, at the same time, one set of the voltage control circuit 30 and the amplifier transistor 63 configured by variable gain amplifier of the third embodiment shown in FIG. 6 may be provided in place of the adder portion 230. In this case, by one variable gain amplifier provided with respect to all pixels of the image sensor, the amplification rate of the electric signal of the first light receiving element can be controlled for each pixel based on the electric signal of the second light receiving element.

Further, for example, in the first embodiment shown in FIG. 3, the voltage control circuit 30 (signal level control circuit) in the third embodiment shown in FIG. 6 may be provided between the transfer transistor 25 and the storage node SN, and the signal level of the electric signal from the second photodiode 6 may be corrected so as to be closer to the signal level of the electric signal corresponding to the amount of the light which was not photoelectrically converted by the first photodiode 5, then added. Note that, the conversion amount of the voltage in the voltage control circuit 30 for approximation may be determined by identifying the correlation of the incident light amount upon the first principal surface S1, the signal level of the electric signal of the first photodiode 5, and the signal level of the electric signal of the second photodiode 6 by experiments etc. as explained in the third embodiment.

Further, for example, in the 10th embodiment shown in FIG. 15, the second photodiode 6 having a larger light receiving area than that of the first photodiode 5 may be arranged shifted to the outer circumferential side of the pixel array region with respect to the first photodiode 5 as in the ninth embodiment shown in FIG. 14. The amount of deviation in this case may be set so that for example d1 becomes equal to t×tan θ1 in the same way as the ninth embodiment.

The first light receiving element only has to be made able to receive the light incident upon one principal surface of the substrate (first principal surface S1 in the embodiment). Accordingly, the first light receiving element may be arranged on the first principal surface S1 as in the first embodiment, may be arranged on the second principal surface S2 as the other principal surface as in the 11th embodiment, or may be buried in the substrate.

The second light receiving element only has to be provided at a position behind the first light receiving element, that is, a position where the light incident upon one principal surface of the substrate and passed through at least one of the first light receiving element and the substrate can be received. The amount of light received by the second light receiving element becomes smaller than the amount of light received by the first light receiving element so far as the energy of the incident light is absorbed in at least a portion of the first light receiving element or at least a portion of the substrate. Therefore, even when the charge exceed the saturation level in the first light receiving element, the light amount distribution can be identified in the second light receiving element. Accordingly, for example the second light receiving element may be buried in the substrate as well. When the second light receiving element is buried in the substrate, it may be buried in the substrate provided with the first light receiving element or may be buried in the other substrate (for example the second substrate 402 of the embodiment).

When the second light receiving element is provided on the second substrate (second substrate 402 in the embodiment), the interval between the substrate provided with the first light receiving element (substrate 2 in the embodiment) and the second substrate may be suitably set. Further, so far as the insulation property between the first light receiving element and the second light receiving element is secured, the substrate provided with the first light receiving element and the second substrate may abut against each other as well. For example, in the sixth embodiment, the substrate 2 and the second substrate 402 may abut against each other as well.

The shape and size of the first light receiving element and the shape and size of the second light receiving element may differ from each other as well. For example, in the 10th embodiment shown in FIG. 15, the case where the light receiving area of the second photodiode 6 as the second light receiving element was larger than the light receiving area of the first photodiode 5 as the first light receiving element was exemplified, but the light receiving area of the second light receiving element may be smaller than the light receiving area of the first light receiving element as well. Note that, when the shape and size of the first light receiving element and the shape and size of the second light receiving element are different, whether or not the second light receiving element is arranged while shifted to the outer circumferential side of the pixel array region with respect to the first light receiving element as in the ninth embodiment shown in FIG. 14 can be identified according to for example whether or not the center of the light receiving surface of the second light receiving element is shifted to the outer circumferential side of the pixel array region with respect to the center of the light receiving surface of the first light receiving element.

The saturation level control portion controlling the saturation level of the first light receiving element may control the saturation level based on at least one of the electric signal of the first light receiving element and the electric signal of the second light receiving element. Accordingly, the control is not limited to one controlling the saturation level based on both of the electric signal of the first light receiving element and the electric signal of the second light receiving element as explained in the first embodiment. The saturation level may be controlled based on only the electric signal of the first light receiving element as in the conventional case, and the saturation level may be controlled based on only the electric signal of the second light receiving element. However, if the saturation level is controlled based on the electric signal of the second light receiving element, in comparison with the case where the saturation level is controlled based on only the electric signal of the first light receiving element, it becomes easy to identify the difference between the incident light amount and the saturation level, and it becomes easy to make the saturation level follow the incident light amount.

Further, the saturation level control portion need only control the saturation level of the first light receiving element so that the degree of the saturation of charge in the first light receiving element is kept within a predetermined range and is not limited to one controlling the saturation level so that there are no longer any saturated pixels. For example, it may be one controlling the saturation level so that the number of saturated pixels becomes a predetermined number.

The invention claimed is:

1. An image sensor provided with:
   a substrate;
   a first light receiving element provided for each of pixels obtained by dividing a substrate into a plurality of areas, provided on the substrate, receiving light incident upon one principal surface of the substrate, and generating a charge in accordance with an amount of light received;
   a second light receiving element provided for each of the pixels, provided at a position in behind side of the first light receiving element, receiving light incident upon the one principal surface and passing through at least one of the first light receiving element and the substrate, and generating a charge in accordance with the amount of light received; and
   a corrector configured so as to increase a signal level of a first electric signal based on the charge generated at the first light receiving element of a pixel, so that the higher a signal level of a second electric signal based on the charge generated at the second light receiving element of the same pixel is, the larger the increase amount is, the corrector thereby correcting the signal level of the first electric signal.

2. An image sensor as set forth in claim 1, wherein
   the first light receiving element is provided on the one principal surface, and
   the second light receiving element is provided on the other principal surface of the substrate.

3. An image sensor as set forth in claim 1, wherein
   the image sensor is provided with a second substrate arranged facing the other principal surface of the substrate, and
   the second light receiving element is provided on the second substrate.

4. An image sensor as set forth in claim 3, wherein
   the first light receiving element is provided on the one principal surface of the substrate, and
   the second light receiving element is provided on a principal surface facing the other principal surface of the substrate in the second substrate.

5. An image sensor as set forth in claim 3, wherein
   the first light receiving element is provided on the other principal surface of the substrate, and
   the second light receiving element is provided on the principal surface facing the other principal surface of the substrate in the second substrate.

6. An image sensor as set forth in claim 3, wherein
   at least a portion of the corrector and a corrector control portion controlling an operation of the corrector are provided on the second substrate.

7. An image sensor as set forth in claim 1, wherein
   the corrector adds the second electric signal to the first electric signal of the same pixel.

8. An image sensor as set forth in claim 1, wherein
   the corrector is provided with an amplifier amplifying the first electric signal, and
   the larger the original signal level of the second electric signal is, the higher the amplifier makes an amplification rate when amplifying the first electric signal.

9. An image sensor as set forth in claim 1, wherein
   the image sensor is provided with
   a third light receiving element arranged on the same plane as the plane having a plurality of the second light receiving elements arranged thereon and a shading portion blocking the light going toward the third light receiving element from the one principal surface, and the corrector corrects the signal level of the second electric signal by subtracting a signal level of an third electric signal based on a charge generated at the third light receiving element from the signal level of the second electric signal and increases the signal level of the first electric signal based on the second signal level after that correction.

10. An image sensor as set forth in claim 1, wherein the image sensor is provided with a saturation level control portion configured so as to control the saturation level of the first light receiving element so that a degree of saturation of the charge at the first light receiving element is kept within a predetermined range in the following process based on at least one of the first electric signal and the second electric signal.

11. An image sensor as set forth in claim 1, wherein, the more a pixel to an outer circumferential side of a pixel array region, the further the second light receiving element is arranged shifted to the outer circumferential side of the pixel array region with respect to the first light receiving element of the same pixel.

12. An image sensor as set forth in claim 1, wherein the second light receiving element has a broader light receiving area than that of the first light receiving element and projected to the outer circumferential side of a pixel array region with respect to the first light receiving element.

13. A camera module is provided with:

a lens, an image sensor in which the light from the lens forms an image, and a signal processing portion configured so as to process an electric signal output by the image sensor, wherein the image sensor is provided with a substrate, a first light receiving element provided for each of the pixels obtained by dividing a substrate into a plurality of areas, provided on the substrate, receiving light incident upon one principal surface of the substrate, and generating a charge in accordance with an amount of light received, and a second light receiving element provided for each of the pixels, provided at a position in behind side of the first light receiving element, receiving light incident upon the one principal surface and passing through at least one of the first light receiving element and the substrate, and generating a charge in accordance with the amount of light received; and the signal processing portion is configured so as to increase a signal level of a first electric signal based on the charge generated at the first light receiving element so that the higher a signal level of a second electric signal based on the charge generated at the second light receiving element of the same pixel is, the larger the increase amount is, the signal processing portion thereby correcting the signal level of the first electric signal.

14. A camera module as set forth in claim 13, wherein the more a pixel is positioned away from an optical axis of the lens, the more the second light receiving element is arranged shifted in a direction away from the optical axis with respect to the first light receiving element of the same pixel.

15. An image sensor comprising:

a substrate with a plurality of pixels;

a plurality of first light receiving elements, each first light receiving element corresponding to one of the plurality of pixels and converting the light received with into a first electric signal;

a plurality of second light receiving elements, each second light receiving element corresponding to one of the plurality of pixels and converting the light received with into a second electric signal; and a corrector configured so as to increase a signal level of the first electric signal so that the higher a signal level of the second electric signal is, the larger the increase amount is, the corrector thereby correcting the signal level of the first electric signal, wherein the plurality of second light receiving elements are located behind the corresponding first light receiving elements, respectively, and each second light receiving element receives the light passing through the corresponding first receiving element.

\* \* \* \* \*